(12) United States Patent
Hsu et al.

(10) Patent No.: US 7,577,783 B2
(45) Date of Patent: Aug. 18, 2009

(54) PORTABLE DATA STORAGE DEVICE AND METHOD OF DYNAMIC MEMORY MANAGEMENT THEREFOR

(75) Inventors: Chang-Wei Hsu, Taipei Hsien (TW); Chun-Chieh Wu, Taipei Hsien (TW)

(73) Assignee: Apacer Technology Inc., Taipei Hsien (TW)

( * ) Notice: Subject to any disclaimer, the term of this patent is extended or adjusted under 35 U.S.C. 154(b) by 77 days.

(21) Appl. No.: 11/381,403

(22) Filed: May 3, 2006

(65) Prior Publication Data

US 2006/0250720 A1     Nov. 9, 2006

(30) Foreign Application Priority Data

May 4, 2005     (TW)     .................................. 94114370

(51) Int. Cl.
*G06F 12/00*     (2006.01)
(52) U.S. Cl. ........................... 711/103; 711/4; 711/100; 711/102; 711/115; 711/165; 711/170; 711/171; 711/172; 711/173; 711/200; 711/202; 365/200; 365/230.01; 365/230.03
(58) Field of Classification Search ...................... 711/4, 711/100, 102–103, 115, 165, 170–173, 200, 711/202; 365/230.01, 230.03, 200
See application file for complete search history.

(56) References Cited

U.S. PATENT DOCUMENTS

| | | | | |
|---|---|---|---|---|
| 5,535,369 A | * | 7/1996 | Wells et al. | 711/171 |
| 5,586,285 A | * | 12/1996 | Hasbun et al. | 711/103 |
| 6,260,156 B1 | * | 7/2001 | Garvin et al. | 714/8 |
| 6,895,464 B2 | * | 5/2005 | Chow et al. | 711/103 |
| 2004/0196707 A1 | * | 10/2004 | Yoon et al. | 365/200 |

\* cited by examiner

*Primary Examiner*—Tuan V Thai
*Assistant Examiner*—Zhuo H Li
(74) *Attorney, Agent, or Firm*—Darby & Darby P.C.

(57) ABSTRACT

A portable data storage device includes a first storage unit having a data storing zone and a reserved zone for bad blocks in the first storage unit, and a second storage unit having a look-up table. The look-up table lists a number of configuration modes for the portable data storage device, each defining specific allocation sizes for the reserved zone and the data storing zone. The portable data storage device is configured to use a kth configuration mode. A method for dynamic memory management includes: i) determining a number of the bad blocks assigned to the reserved zone; ii) with reference to the look-up table, determining if this number is greater than a limit associated with the kth configuration mode; and iii) if so, reconfiguring the portable data storage device to use a (k+1)th configuration mode.

18 Claims, 2 Drawing Sheets

| Configuration mode | Size of reserved zone | Size of data storing zone (blocks) |
|---|---|---|
| 1 | 8 | 1016 |
| 2 | 16 | 1008 |
| 3 | 24 | 1000 |
| 4 | 32 | 992 |
| 5 | 40 | 984 |
| 6 | 48 | 976 |
| ⋮ | ⋮ | ⋮ |
| n | 8n | 1024−8n |

←411

| Configuration mode | Size of reserved zone | Size of data storing zone (blocks) |
|---|---|---|
| 1 | 8 | 1016 |
| 2 | 16 | 1008 |
| 3 | 24 | 1000 |
| 4 | 32 | 992 |
| 5 | 40 | 984 |
| 6 | 48 | 976 |
| ⋮ | ⋮ | ⋮ |
| n | 8n | 1024-8n |

← 411

PORTABLE DATA STORAGE DEVICE AND METHOD OF DYNAMIC MEMORY MANAGEMENT THEREFOR

CROSS-REFERENCE TO RELATED APPLICATION

This application claims priority of Taiwanese Application No. 094114370, filed on May 4, 2005.

BACKGROUND OF THE INVENTION

1. Field of the Invention

The invention relates to a portable data storage device and to a method of dynamic memory management for the portable data storage device.

2. Description of the Related Art

A semiconductor memory, e.g., USB pen drive, is usually configured to have a data storing zone for stored data, and a reserved zone used when conducting write and erase operations and also used for bad blocks, storage of passwords, etc. For example, in the case of a 128 MB flash memory, where a block unit is 128 KB, there would be 1024 blocks, 992 of which can be allocated to the data storing zone and 32 of which can be allocated to the reserved zone. The size allocations for the data storing zone and the reserved zones are fixed beforehand and cannot be modified by the user.

The physical blocks included in the data storing zone and the reserved zone are not fixed and are not necessarily contiguous. Any block having no data stored therein or containing erased data may be assigned to the reserved zone. However, once data is written into the reserved zone, the blocks in the reserved zone that store the written data would be reassigned to the data storing zone, and other blocks in the data storing zone must be concomitantly assigned to the reserved zone in order to maintain the fixed size allocations of the data storing zone and the reserved zone.

The reserved zone includes free blocks, bad blocks, and other blocks. The number of free blocks must be non-zero to enable data writing and erasing operations. However, when the number of bad blocks in the reserved zone increases, the number of the free blocks in the reserved zone decreases accordingly. As a result, when the number of free blocks in the reserved zone eventually reaches zero, data writing and erasing operations are no longer possible, and the semiconductor memory is no longer usable.

While it is possible to fix a larger size allocation for the reserved zone to accommodate a larger number of bad blocks so as to prolong the service life of the semiconductor memory, the size of the data storing zone would be undesirably reduced.

SUMMARY OF THE INVENTION

Therefore, an object of the present invention is to provide a portable data storage device and a method of dynamic memory management for the portable data storage device, in which sizes of a data storing zone and a reserved zone of the portable data storage device may be dynamically varied as needed.

According to one aspect, the method of dynamic memory management of this invention is used for a portable data storage device having a data storing zone and a reserved zone for bad blocks of the portable data storage device. The method comprises: a) providing a look-up table that lists a number (n) of configuration modes available for use by the portable data storage device, where (n) is a positive integer, each of the configuration modes defining a respective allocation size of the reserved zone relative to a combined total size of the data storing zone and the reserved zone, the configuration modes being listed in the look-up table in a sequence of increasing allocation sizes of the reserved zone; b) configuring the portable data storage device to use a kth configuration mode, where $1 \leq k \leq n$; c) determining a number of the bad blocks assigned to the reserved zone; d) with reference to the look-up table, determining if the number of the bad blocks assigned to the reserved zone is greater than a limit associated with the kth configuration mode; and e) if the number of the bad blocks assigned to the reserved zone is determined to be greater than the associated limit, reconfiguring the portable data storage device such that the configuration mode used thereby is changed from the kth configuration mode to the (k+1)th configuration mode.

According to another aspect of this invention, the portable data storage device comprises: a first storage unit having a data storing zone and a reserved zone for bad blocks in the first storage unit; a second storage unit having a look-up table established therein, the look-up table listing a number (n) of configuration modes available for use by the portable data storage device, where (n) is a positive integer, each of the configuration modes defining a respective allocation size of the reserved zone relative to a combined total size of the data storing zone and the reserved zone, the configuration modes being listed in the look-up table in a sequence of increasing allocation sizes of the reserved zone; the portable data storage device being configured to use a kth configuration mode, where $1 \leq k \leq n$; and a set of program instructions adapted for causing a computer connected to the portable data storage device to execute consecutive steps of the method for dynamic memory management of the portable data storage device.

According to yet another aspect of this invention, a computer program product comprises a computer readable storage medium having a set of program instructions stored therein, the program instructions being adapted for causing a computer connected to a portable data storage device to execute consecutive steps of the method for dynamic memory management of the portable data storage device.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figures 1, 2:
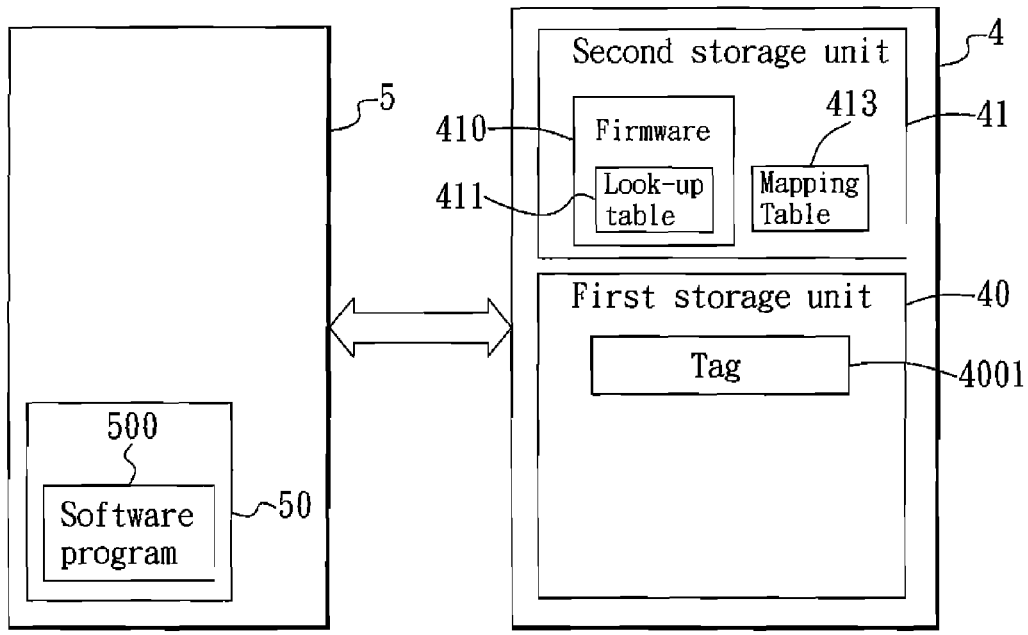
FIG. 1 is a schematic circuit block diagram of a portable data storage device according to a preferred embodiment of the present invention, illustrating the portable data storage device coupled to a computer.
FIG. 2 illustrates an example of a look-up table according to the preferred embodiment.

Referring to FIG. 1, a portable data storage device 4 according to a preferred embodiment of the present invention includes a first storage unit 40 and a second storage unit 41. As an example, the portable data storage device 4 of the present invention may be a USB pen drive or a memory card.

The first storage unit 40, which is a 128 MB flash memory in this embodiment, has a data storing zone 401 and a reserved zone 400, the purposes of which have been described hereinbefore. The reserved zone 400 is defined with free blocks (e.g., eight free blocks), actual bad blocks (e.g., zero in ideal situations), and other blocks (e.g., one block). As mentioned hereinabove, the number of free blocks must be non-zero to enable data writing and erasing operations. In addition, as the number of bad blocks assigned to the reserved zone 400 increases, the number of the free blocks in the reserved zone 400 is reduced correspondingly.

The reserved zone 400 has a tag 4001 that identifies a present configuration mode, i.e., a kth configuration mode, of the portable data storage device 4. The configuration mode indicates a specific allocation size of the reserved zone 400 relative to a combined total size of the data storing zone 401 and the reserved zone 400.

The second storage unit 41, which is an electrically erasable programmable read-only memory (EEPROM) or an erasable programmable read-only memory (EPROM) in this embodiment, has a look-up table 411 established therein. In this embodiment, the second storage unit 41 includes firmware 410 having the look-up table 411 established therein. Referring to FIG. 2, the look-up table 411 lists a number (n) of the configuration modes available for use by the portable data storage device 4, where (n) is a positive integer. The configuration modes are listed in the look-up table 411 in a sequence of increasing allocation sizes of the reserved zone 400 and corresponding decreasing allocation sizes of the data storing zone 401, in which one block is 128 KB such that for a 128 MB total size, there would be a total of 1024 blocks. As the configuration mode is incremented, which will be described below, the allocation size of the reserved zone 400 is increased while that for the data storing zone 401 is decreased by a corresponding amount.

The second storage unit 41 further has a mapping table (not shown) for mapping the bad blocks in the portable data storage device 4 in a conventional manner. It follows, then, that the mapping table may be used also to determine the number of the bad blocks assigned to the reserved zone 400.

After determination of the number of the bad blocks assigned to the reserved zone 400, the portable data storage device 4 is configured to use a kth configuration mode, where $1 \leq k \leq n$. As an example, the kth configuration mode may be determined by a manufacturer as follows:

$$k = \text{(bad blocks in portable data storage device} + 5)/8$$

where k is a positive integer rounded up unconditionally.

Figure 3:
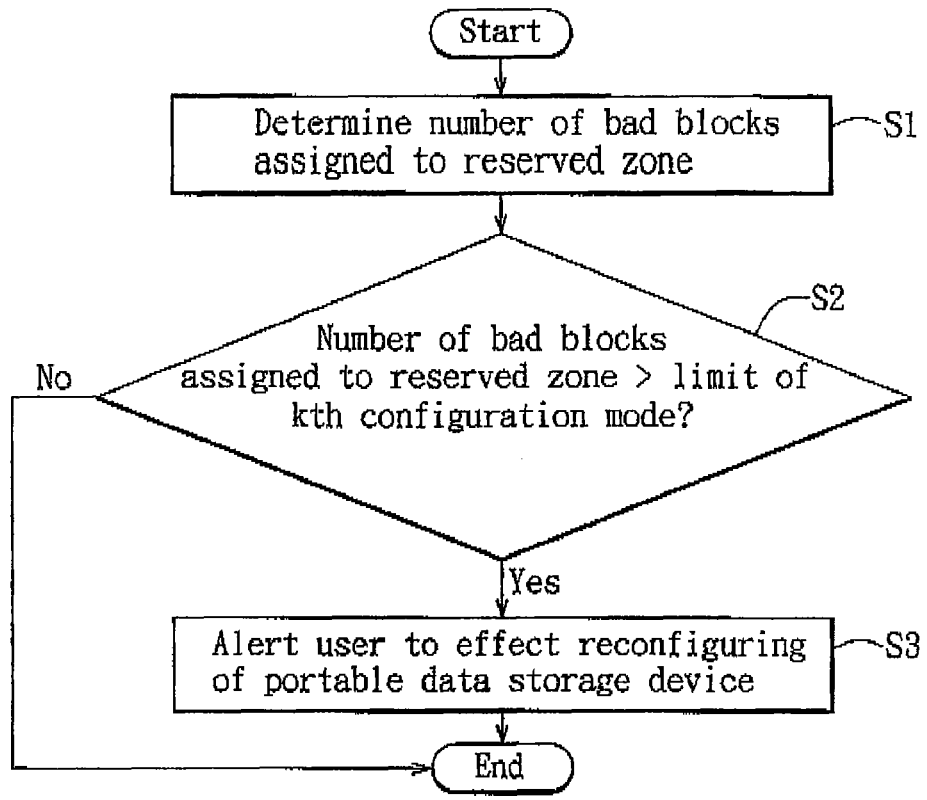
FIG. 3 is a flowchart illustrating the steps associated with determining if the number of bad blocks assigned to a reserved zone is greater than a limit associated with a present configuration mode in accordance with a preferred embodiment of a method of dynamic memory management of the present invention.

In this embodiment, when the portable storage device 4 is coupled to a computer 5, the firmware 410 in the second storage unit 41 causes the computer 5 to execute processes to determine if the kth configuration mode is no longer suited for the number of the bad blocks assigned to the reserved zone 400. Depending on the outcome of this determination, the firmware 410 further causes the computer 5 to execute a process of alerting the user that the kth configuration mode is not suitable for the number of the bad blocks assigned to the reserved zone 400. The user may then run a software program 500 stored in a computer-readable medium 50 of the computer 5 to reconfigure the portable data storage device 4. These processes performed in accordance with the firmware 410 in the portable data storage device 4 and the software program 500 stored in the computer 5 comprise parts of a method for dynamic memory management of the present invention, which will he described in greater detail below. With reference to FIG. 3, the number of the bad blocks assigned to the reserved zone 400 is determined in step Sl. Next, it is determined in step S2 by referencing the look-up table 411 if the number of the bad blocks assigned to the reserved zone 400 is greater than a limit associated with the kth configuration mode. In this embodiment, the tag 4001 in the reserved zone 400 is used to reference the look-up table 411 to make this determination, in which the tag 4001 may be initially established using the equation for (k) provided above. If the number of the bad blocks assigned to the reserved zone 400 is not greater than the limit associated with the kth configuration mode, then the process is ended. If, on the other hand, the number of the bad blocks assigned to the reserved zone 400 is greater than the limit associated with the kth configuration mode, the user is alerted in step S3 through the computer 5 to reconfigure the portable data storage device 4. As described above, the firmware 410 in the second storage unit 41 causes the computer 5 to execute the processes of FIG. 3 in this embodiment.

Figure 4:
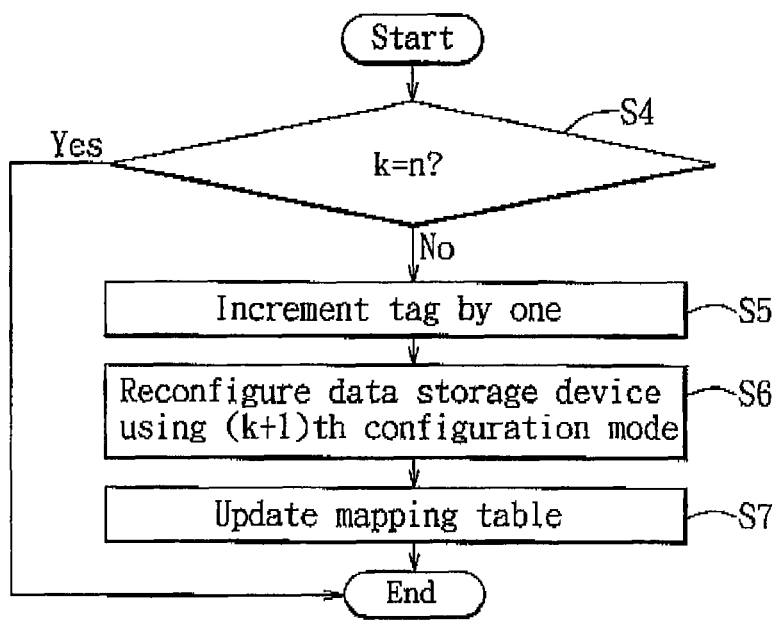
FIG. 4 is a flowchart illustrating the steps involved in reconfiguring the portable data storage device in accordance with the preferred embodiment.

FIG. 4 shows the processes involved in reconfiguring the portable data storage device 4. In this embodiment, the processes to reconfigure the portable data storage device 4 are initiated by the user after receiving an alert message as described above.

In step S4, it is determined if the configuration mode currently used by the portable data storage device 4 is the nth configuration mode, that is, it is determined if k=n. If so, then the process is ended and reconfiguration of the portable data storage device 4 is not performed. In this case, a message may be output to the user informing him or her that reconfiguration is no longer possible.

However, if (k) is not equal to (n) in step S4, the tag 4001 in the reserved zone 400 is incremented by one so that the tag 4001 identifies the (k+1)th configuration mode in step S5.

Next, in step S6, the portable data storage device 4 is reconfigured to use the (k+1)th configuration mode. This involves increasing the size of the reserved zone 400 while decreasing the size of the data storing zone 401 by a corresponding amount.

Finally, in step S7, the mapping table in the second storage unit 41 is updated. That is, all the bad blocks are mapped to the reserved zone 400, which has been increased in size in step S6. Reformatting of the first storage unit 40 can be done at this time.

It should be appreciated by those skilled in the art that a back-up of the contents of the first storage unit 40 may be performed before reconfiguring the portable data storage device 4 to use the (k+1)th configuration mode to avoid loss of data.

It is to be noted that as an alternative to storing part of the program instructions associated with the dynamic memory management method of the present invention in the firmware 410 of the second storage unit 41 and part in the computer-readable medium 50 of the computer 5 as described above, all of the program instructions may reside in the second storage unit 41 or in the computer-readable medium 50 of the computer 5. The computer-readable medium 50 may be a hard disk, an optical disk, a portable hard disk, or a network disk drive.

In the above-described portable data storage device 4 and method of dynamic memory management for the portable data storage device 4 of the present invention, the sizes of the data storing zone 401 and the reserved zone 400 of the portable data storage device 4 may be dynamically varied as needed. Hence, optimum sizes for the data storing zone 401 and the reserved zone 400 may be realized subsequent to manufacture, such that problems associated with permanently establishing the size of the reserved zone 400 to be too large or too small are overcome.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A method of dynamic memory management for a portable data storage device having a data storing zone and a reserved zone for bad blocks in the portable data storage device, the bad blocks being unusable and unrecoverable, said method comprising:
   a) providing a look-up table that lists a number (n) of all possible current and non-current configuration modes available for use by the portable data storage device, where (n) is a positive integer, each of the configuration modes defining a respective allocation size of the reserved zone relative to a combined total size of the data storing zone and the reserved zone, the configuration modes being listed in the look-up table in a sequence of increasing allocation sizes of the reserved zone;
   b) configuring the portable data storage device to use a kth configuration mode from the look-up table by setting the size of the reserved zone to be the allocation size of the reserved zone of the kth configuration mode, and setting the size of the data storing zone by a corresponding amount, where $1 \leq k \leq n$;
   c) determining a number of the bad blocks assigned to the reserved zone;
   d) with reference to the look-up table, determining if the number of the bad blocks assigned to the reserved zone is greater than a limit associated with the kth configuration model and
   e) if the number of the bad blocks assigned to the reserved zone is determined to be greater than the associated limit, reconfiguring the portable data storage device such that the configuration mode used thereby is changed from the kth configuration mode to the (k+1)th configuration mode, said reconfiguring being performed by setting the size of the reserved zone to be the allocation size of the reserved zone of the (k+1)th configuration mode, and setting the size of the data storing zone by a corresponding amount.

2. The method of claim 1, wherein the portable data storage device includes a first storage unit and a second storage unit, the first storage unit having the data storing zone and the reserved zone, the second storage unit having the look-up table established therein.

3. The method of claim 1, wherein, in step b), a tag that identifies the kth configuration mode is stored in the reserved zone,
wherein, in step d), the tag in the reserved zone is used to reference the look-up table, and wherein step e) includes:
   incrementing the tag in the reserved zone by one so that the tag identifies the (k+1)th configuration mode; and
   reconfiguring the portable data storage device to use the (k+1)th configuration mode.

4. The method of claim 1, wherein reconfiguring of the portable data storage device is not performed in step e) when the configuration mode currently used by the portable data storage device is the nth configuration mode.

5. The method of claim 1, wherein the portable data storage device further has a mapping table for mapping the bad blocks to the reserved zone,
   wherein the number of the bad blocks assigned to the reserved zone is determined from the mapping table in step c), and
   wherein the mapping table is updated in step e) when the portable data storage device is reconfigured from the kth configuration mode to the (k+1)th configuration mode.

6. A portable data storage device comprising:
   a first storage unit having a data storing zone and a reserved zone for bad blocks in said first storage unit, the bad blocks being unusable and uncoverable;
   a second storage unit having a look-up table established therein, the look-up table listing a number (n) of all possible current and non-current configuration modes available for use by said portable data storage device, where (n) is a positive integer, each of the configuration modes defining a respective allocation size of said reserved zone relative to a combined total size of said data storing zone and said reserved zone, the configuration modes being listed in the look-up table in a sequence of increasing allocation sizes of said reserved zone;
   said portable data storage device being configured to use a kth configuration mode from the look-up table by setting the size of the reserved zone to be the allocation size of the reserved zone of the kth configuration mode, and setting the size of the data storing zone by a corresponding amount, where $1 \leq k \leq n$; and
   a set of program instructions adapted for causing a computer connected to said portable data storage device to execute consecutive steps of a method for dynamic memory management of said portable data storage device, said method comprising:
      i) determining a number of the bad blocks assigned to said reserved zone;
      ii) with reference to the look-up table, determining if the number of the bad blocks assigned to said reserved zone is greater than a limit associated with the kth configuration model and
      iii) if the number of the bad blocks assigned to said reserved zone is determined to be greater than the associated limit, reconfiguring said portable data storage device such that the configuration mode used thereby is changed from the kth configuration mode to the (k+1)th configuration mode, the reconfiguring being performed by setting the size of the reserved zone to be the allocation size of the reserved zone of the (k+1)th configuration mode, and setting the size of the data storing zone by a corresponding amount.

7. The portable data storage device of claim 6, wherein said reserved zone has a tag that identifies the kth configuration mode stored therein,
   wherein, in step ii) of said method, the tag in said reserved zone is used to reference the look-up table, and
   wherein step iii) of said method includes:

incrementing the tag in said reserved zone by one so that the tag identifies the (k+1)th configuration mode; and reconfiguring said portable data storage device to use the (k+1)th configuration mode.

8. The portable data storage device of claim 6, wherein reconfiguring of said portable data storage device is not performed in step iii) of said method when the configuration mode currently used by said portable data storage device is the nth configuration mode.

9. The portable data storage device of claim 6, wherein said second storage unit further has a mapping table for mapping the bad blocks to said reserved zone,
wherein the number of the bad blocks assigned to said reserved zone is determined from the mapping table in step i) of said method, and
wherein the mapping table is updated in step iii) of said method when said portable data storage device is reconfigured from the kth configuration mode to the (k+1}th configuration mode.

10. The portable data storage device of claim 6, wherein said portable data storage device is one of a portable hard disk and a memory card.

11. The portable data storage device of claim 6, wherein said program instructions reside in said second storage unit.

12. The portable data storage device of claim 6, wherein said program instructions reside in a computer readable storage medium selected from the group consisting of a hard disk, an optical disk, a portable hard disk, and a network disk drive.

13. A computer program product comprising a computer readable storage medium having a set of program instructions stored therein, said program instructions being adapted for causing a computer connected to a portable data storage device to execute consecutive steps of a method for dynamic memory management of the portable data storage device, the portable data storage device including a first storage unit having a data storing zone and a reserved zone for bad blocks in the first storage unit, the bad blocks in the reserved zone being unusable and unrecoverable, and a second storage unit having a look-up table established therein, the look-up table listing a number (n) of all possible current and non-current configuration modes available for use by the portable data storage device, where (n) is a positive integer, each of the configuration modes defining a respective allocation size of the reserved zone relative to a combined total size of the data storing zone and the reserved zone, the configuration modes being listed in the look-up table in a sequence of increasing allocation sizes of the reserved zone, the portable data storage device being configured to use a kth configuration mode by setting the size of the reserved zone to be the allocation size of the reserved zone of the kth configuration mode, and setting the size of the data storing zone by a corresponding amount where $1 \leq k \leq n$ said method comprising:
  i) determining a number of the bad blocks assigned to the reserved zone;
  ii) with reference to the look-up table, determining if the number of the bad blocks assigned to the reserved zone is greater than a limit associated with the kth configuration mode; and
  iii) if the number of the bad blocks assigned to the reserved zone is determined to be greater than the associated limit, reconfiguring the portable data storage device such that the configuration mode used thereby is changed from the kth configuration mode to the (k+1)th configuration mode, the reconfiguring being performed by setting the size of the reserved zone to be the allocation size of the reserved zone of the (k+1)th configuration mode, and setting the size of the data storing zone by a corresponding amount.

14. The computer program product of claim 13, wherein the reserved zone has a tag that identifies the kth configuration mode stored therein,
wherein, in step ii) of said method, the tag in the reserved zone is used to reference the look-up table, and
wherein step iii) of said method includes:
  incrementing the tag in the reserved zone by one so that the tag identifies the (k+1)th configuration mode; and
  reconfiguring the portable data storage device to use the (k+1)th configuration mode.

15. The computer program product of claim 13, wherein reconfiguring of the portable data storage device is not performed in step iii) of said method when the configuration mode currently used by the portable data storage device is the nth configuration mode.

16. The computer program product of claim 13, wherein the second storage unit further has a mapping table for mapping the bad blocks to the reserved zone,
wherein the number of the bad blocks assigned to the reserved zone is determined from the mapping table in step i) of said method, and
wherein the mapping table is updated in step iii) of said method when the portable data storage device is reconfigured from the kth configuration mode to the (k+1) th configuration mode.

17. A method of dynamic memory management for a portable data storage device having a data storing zone and a reserved zone for bad blocks in the portable data storage device, the bad blocks being unusable and unrecoverable, said method comprising:
  a) providing a plurality of configuration modes available for use by the portable data storage device, each of the configuration modes defining a respective allocation size of the reserved zone relative to a combined total size of the data storing zone and the reserved zone; and
  b) enabling the portable data storage device to switch, out of the plurality of configuration modes, from a first configuration mode to a second configuration mode, by setting the size of the reserved zone of the portable data storage device initially of the allocation size of the reserved zone in the first configuration mode to be the allocation size of the reserved zone of the second configuration mode, and setting the size of the data storing zone of the portable data storage device by a corresponding amount.

18. The method of claim 3, further comprising the step of performing steps d) and e) with the incremented tag.

* * * * *